United States Patent
Bellorado et al.

(10) Patent No.: US 10,177,771 B1
(45) Date of Patent: Jan. 8, 2019

(54) MULTI-SIGNAL REALIGNMENT FOR CHANGING SAMPLING CLOCK

(71) Applicant: Seagate Technology LLC, Cupertino, CA (US)

(72) Inventors: Jason Bellorado, San Jose, CA (US); Marcus Marrow, San Jose, CA (US); Zheng Wu, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/724,001

(22) Filed: Oct. 3, 2017

Related U.S. Application Data

(60) Provisional application No. 62/522,248, filed on Jun. 20, 2017.

(51) Int. Cl.
| | |
|---|---|
| *H03L 7/081* | (2006.01) |
| *H03L 7/07* | (2006.01) |
| *H03L 7/091* | (2006.01) |
| *H03K 5/135* | (2006.01) |
| *H04L 7/033* | (2006.01) |
| *H03K 5/00* | (2006.01) |
| *H04L 7/00* | (2006.01) |

(52) U.S. Cl.
CPC .......... *H03L 7/0814* (2013.01); *H03K 5/135* (2013.01); *H03L 7/07* (2013.01); *H03L 7/091* (2013.01); *H03K 2005/00019* (2013.01); *H04L 7/0025* (2013.01); *H04L 7/0331* (2013.01)

(58) Field of Classification Search
None
See application file for complete search history.

(56) References Cited

U.S. PATENT DOCUMENTS

| | | | |
|---|---|---|---|
| 5,321,564 | A | 6/1994 | Takahashi |
| 5,742,532 | A | 4/1998 | Duyne et al. |
| 5,970,093 | A | 10/1999 | Lantremange |
| 6,157,510 | A | 12/2000 | Schreck et al. |
| 6,320,920 | B1 | 11/2001 | Beyke |
| 6,377,552 | B1 | 4/2002 | Moran et al. |
| 6,670,901 | B2 | 12/2003 | Brueske et al. |
| 6,687,073 | B1 | 2/2004 | Kupferman |

(Continued)

OTHER PUBLICATIONS

Bellorado et al., "Target Parameter Adaptation", U.S. Appl. No. 15/334,167, filed Oct. 25, 2015, Seagate Technology LLC.

*Primary Examiner* — Cassandra Cox
(74) *Attorney, Agent, or Firm* — Cesari & Reed, LLP; Kirk A. Cesari; Logan Brown

(57) ABSTRACT

An apparatus may include a circuit configured to receive first and second samples of an underlying data from respective first and second sample periods and which correspond to respective first and second sensors, a phase control value may have first and second values during respective first and second sample periods. The phase control value may be a control value for a sample clock signal. The circuit may also determine a difference in the phase control value between the first value and the second value. The circuit may then digitally interpolate the first and second samples to produce a phase shifted first and second samples where the digital interpolation of at least one of the first and second samples mat be at least in part based on the difference in the phase control value to compensate for a phase misalignment between the first sample and the second sample.

20 Claims, 5 Drawing Sheets

(56) References Cited

U.S. PATENT DOCUMENTS

| | | |
|---|---|---|
| 6,697,891 B2 | 2/2004 | Emberty et al. |
| 6,738,215 B2 | 5/2004 | Yatsu |
| 6,950,258 B2 | 9/2005 | Takaishi |
| 6,993,291 B2 | 1/2006 | Parssinen et al. |
| 7,046,701 B2 | 5/2006 | Mohseni et al. |
| 7,133,233 B1 | 11/2006 | Ray et al. |
| 7,245,448 B2 | 7/2007 | Urata |
| 7,298,573 B2 | 11/2007 | Kitamura |
| 7,324,437 B1 | 1/2008 | Czylwik et al. |
| 7,362,432 B2 | 4/2008 | Roth |
| 7,940,667 B1 | 5/2011 | Coady |
| 8,139,301 B1 | 3/2012 | Li et al. |
| 8,172,755 B2 | 5/2012 | Song et al. |
| 8,400,726 B1 | 3/2013 | Wu et al. |
| 8,456,977 B2 * | 6/2013 | Honma ............ G11B 20/10046 369/112.14 |
| 8,479,086 B2 | 7/2013 | Xia et al. |
| 8,514,506 B1 | 8/2013 | Li et al. |
| 8,539,328 B2 | 9/2013 | Jin et al. |
| 8,542,766 B2 | 9/2013 | Chekhovstov et al. |
| 8,713,413 B1 | 4/2014 | Bellorado et al. |
| 8,755,139 B1 | 6/2014 | Zou et al. |
| 8,760,794 B1 | 6/2014 | Coker et al. |
| 8,837,068 B1 | 9/2014 | Liao et al. |
| 8,861,111 B1 | 10/2014 | Liao et al. |
| 8,861,112 B1 | 10/2014 | Pan et al. |
| 8,953,276 B1 | 2/2015 | Pokharel |
| 9,007,707 B1 | 4/2015 | Lu et al. |
| 9,019,642 B1 * | 4/2015 | Xia ................. G11B 20/10009 360/25 |
| 9,064,537 B1 | 6/2015 | Nie |
| 9,082,418 B2 | 7/2015 | Ong et al. |
| 9,093,115 B1 | 7/2015 | Fung et al. |
| 9,099,132 B1 | 8/2015 | Grundvig et al. |
| 9,129,650 B2 | 9/2015 | Mathew et al. |
| 9,147,416 B2 * | 9/2015 | Grundvig ............. G11B 5/4886 |
| 9,196,298 B1 | 11/2015 | Zhang et al. |
| 9,245,579 B2 | 1/2016 | Song et al. |
| 9,245,580 B1 | 1/2016 | Lu et al. |
| 9,257,135 B2 | 2/2016 | Ong et al. |
| 9,286,915 B1 * | 3/2016 | Dziak .................... G11B 5/012 |
| 9,311,937 B2 | 4/2016 | Zou et al. |
| 9,401,161 B1 | 7/2016 | Jury |
| 9,424,878 B1 | 8/2016 | Dziak et al. |
| 9,431,052 B2 | 8/2016 | Oberg et al. |
| 9,508,369 B2 | 11/2016 | Chu et al. |
| 9,542,972 B1 * | 1/2017 | Nayak ............. G11B 20/10046 |
| 9,564,157 B1 | 2/2017 | Trantham |
| 9,590,803 B2 | 3/2017 | Derras et al. |
| 9,672,850 B2 | 6/2017 | Grundvig et al. |
| 9,728,221 B2 | 8/2017 | Oberg et al. |
| 9,947,362 B1 | 4/2018 | Venkataramani et al. |
| 10,014,026 B1 * | 7/2018 | Wu .................... G11B 20/1024 |
| 2002/0181439 A1 | 12/2002 | Orihashi et al. |
| 2003/0198165 A1 * | 10/2003 | Mouri et al. |
| 2010/0290153 A1 | 11/2010 | Hampshire |
| 2011/0090773 A1 | 4/2011 | Yu et al. |
| 2011/0176400 A1 | 7/2011 | Gerasimov |
| 2012/0105994 A1 | 5/2012 | Bellorado et al. |
| 2012/0155577 A1 | 6/2012 | Shukla et al. |
| 2017/0249206 A1 | 8/2017 | Jeong et al. |

* cited by examiner

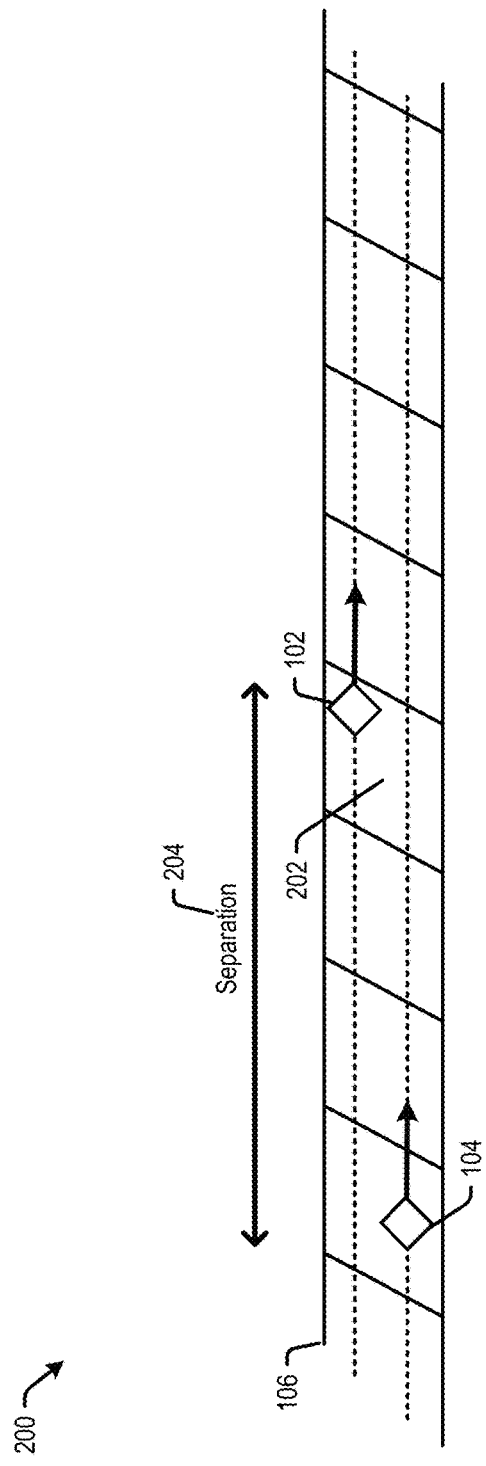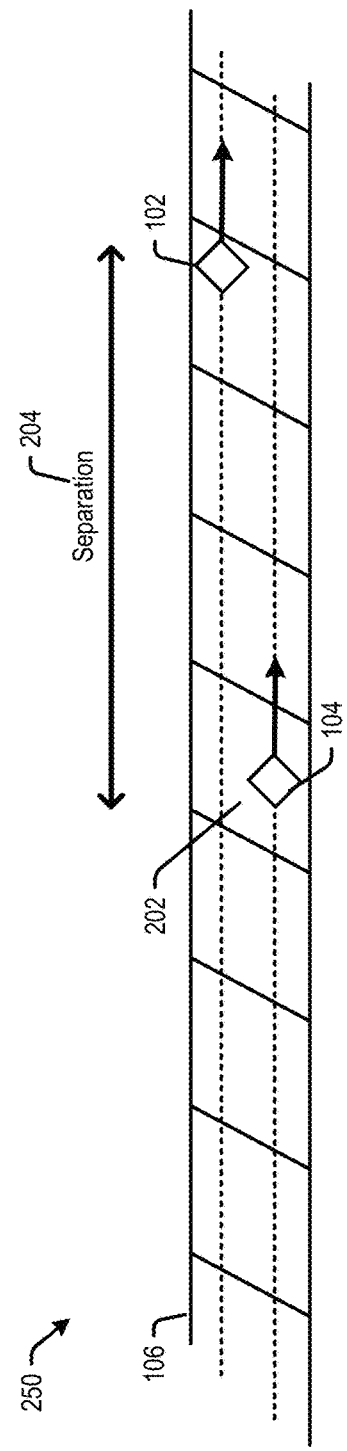
FIG. 2A
FIG. 2B

MULTI-SIGNAL REALIGNMENT FOR CHANGING SAMPLING CLOCK

SUMMARY

In certain embodiments, an apparatus may include a circuit configured to receive a first sample of a first sample period, the first sample corresponding to a first sensor, a phase control value having a first value during the first sample period and to receive a second sample of a second sample period, the second sample corresponding to a second sensor, the phase control value having a second value during the second sample period, the first sample and the second sample being samples of the same underlying data, and the phase control value being a control value for a sample clock signal associated with the first sample and the second sample. The circuit may also determine a difference in the phase control value between the first value during the first sample period and the second value during the second sample period. The circuit may then digitally interpolate the first sample to produce a phase shifted first sample and digitally interpolate the second sample to produce a phase shifted second sample, the digital interpolation of at least one of the first sample and the second sample being at least in part based on the difference in the phase control value to compensate for a phase misalignment between the first sample and the second sample due to the difference in the phase control value between the first value during the first sample period and the second value during the second sample period.

In certain embodiments, a system may include a first delay module configured to receive a first sample of a first sample period, the first sample corresponding to a first sensor, a phase control value having a first value during the first sample period and a second delay module configured to receive a second sample of a second sample period, the second sample corresponding to a second sensor, the phase control value having a second value during the second sample period, the first sample and the second sample being samples of the same underlying data, and the phase control value being a control value for a sample clock signal associated with the first sample and the second sample. The system may further include a timing control circuit configured to determine a difference in the phase control value between the first value during the first sample period and the second value during the second sample period. The first delay module may be further configured to digitally interpolate the first sample to produce a phase shifted first sample and the second delay module may be further configured to digitally interpolate the second sample to produce a phase shifted second sample, the digital interpolation of at least one of the first sample and the second sample being at least in part based on the difference in the phase control value to compensate for a phase misalignment between the first sample and the second sample due to the difference in the phase control value between the first value during the first sample period and the second value during the second sample period.

In certain embodiments, a method may include receiving a first sample of a first sample period, the first sample corresponding to a first sensor, a phase control value having a first value during the first sample period and receiving a second sample of a second sample period, the second sample corresponding to a second sensor, the phase control value having a second value during the second sample period, the first sample and the second sample being samples of the same underlying data, and the phase control value being a control value for a sample clock signal associated with the first sample and the second sample. The method may further include determining a difference in the phase control value between the first value during the first sample period and the second value during the second sample period, digitally interpolating the first sample to produce a phase shifted first sample, and digitally interpolating the second sample to produce a phase shifted second sample, the digital interpolation of at least one of the first sample and the second sample being at least in part based on the difference in the phase control value to compensate for a phase misalignment between the first sample and the second sample due to the difference in the phase control value between the first value during the first sample period and the second value during the second sample period.

BRIEF DESCRIPTION OF THE DRAWINGS

FIGS. 2A and 2B illustrate a MSMR system in operation at a first time and a second time, respectively, in accordance with certain embodiments of the present disclosure;

DETAILED DESCRIPTION

Figure 1:
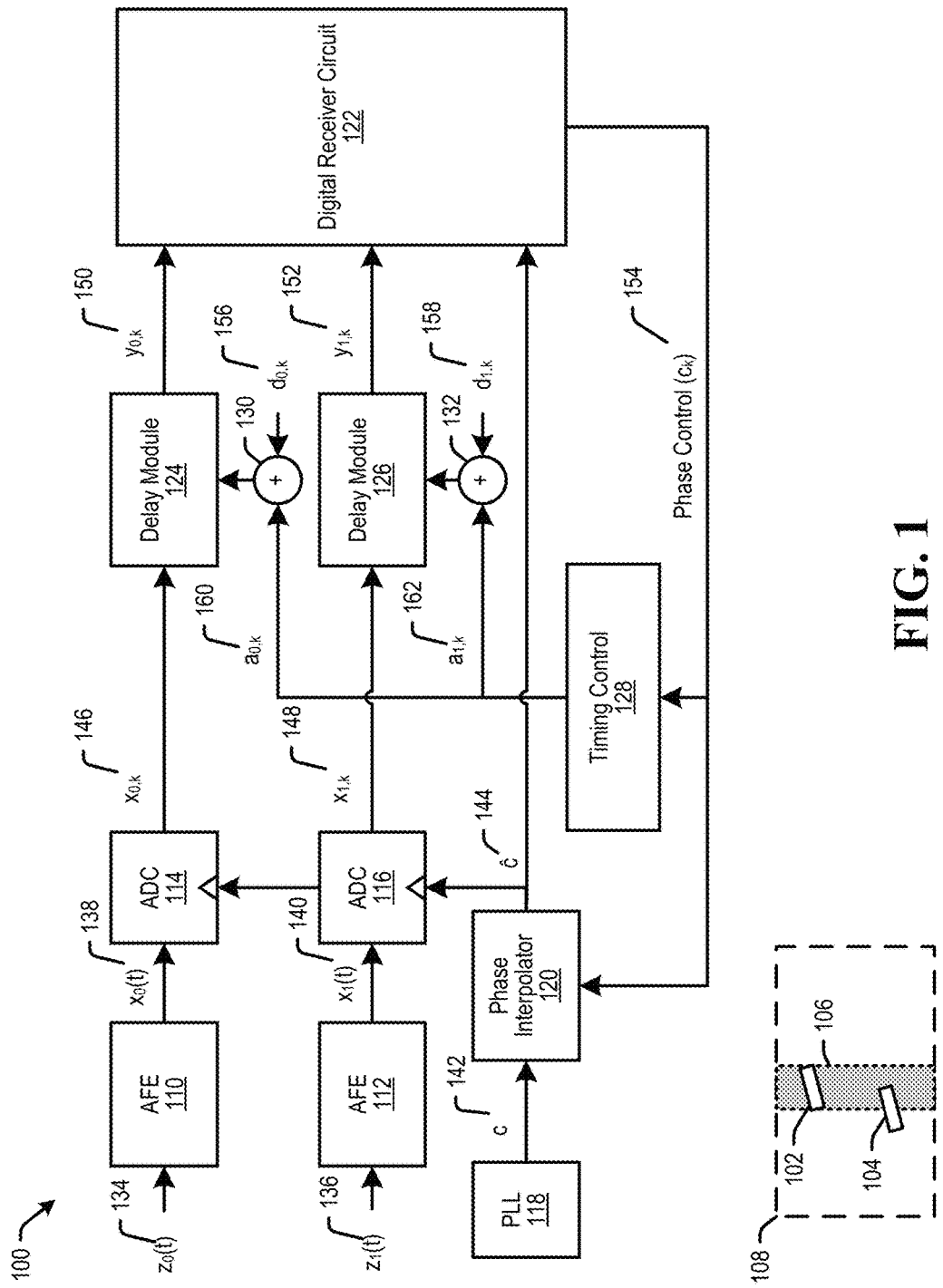
FIG. 1 is a block diagram of a communication channel which may include functionality to compensate for differences in phase adjustment between the sensing of the multiple signals, in accordance with certain embodiments of the present disclosure.

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

The present disclosure generally relates to multi-sensor systems, and in some embodiments, the present disclosure may relate to multi-sensor systems that may have a delay between signal reception and which may realign the signals to compensate for the delay. The multi-sensor system may further utilize a clock to sample both signals, the phase of which may be digitally controlled. In addition, the multi-sensor system may include functionality to compensate for differences in sampling phase due to clock adjustments occurring between each sensor's sampling of a given portion of the signal.

Some systems, such as electrical, electronic, motor drive, processing, or other systems may receive a signal of interest and process that signal. For example, a read channel of a multi-sensor communication system or a magnetic recording storage system may receive multiple analog input signals of the same underlying data at respective sensors (e.g. multiple read heads sensing the same track of a magnetic storage medium). The read channel may then sample the input signals to generate respective digitized samples.

In some systems, sampling of the digitized signals may be synchronized to a given (expected) sampling phase before being applied to a digital receiver. For example, the digital receiver may be a detector, a decoder, a filter or other digital system. In some digital receivers, the multiple respective digitized samples, once synchronized, may be processed together by the digital receiver to reconstruct the underlying data. In some such systems, the digital receiver may provide a phase control signal as feedback that may be used for performing the synchronization of the sampling to the phase of the input signals.

As mentioned above, in some embodiments, a delay may be present between the sensing of the underlying data by different sensors of the multi-sensor system. For example, a wireless receiver in which multiple antennas may be used to receive the same signal may have different propagation delays due to the path from the transmitter to the receivers being different lengths. In an example in multi-sensor magnetic recording (MSMR), multiple read-sensors may be fabricated on the same read-head such that multiple reads of the same recorded track may be obtained simultaneously. Since it may not be possible to fabricate the sensors in the same location, there may be a physical separation of the readers in the downtrack direction. This separation may cause time misalignment between the read-back signals in that a leading reader may sense a given bit-cell earlier than a trailing reader as the heads move over the medium. In some such cases, the separation of the readers may vary depending on the area of the medium being read (e.g. the orientation of the read head to the medium may change as the read head moves from an inner track to an outer track or vice versa).

In some embodiments, the system may align the received signals (e.g. using a known or estimated relative misalignment, or both). For example, the system may include delay modules to compensate for the misalignment of the received signals. Such delay modules may include a tapped delay-line and a digital interpolation filter which may be able to provide delays that compensate for the misalignment of the received signals. More particularly, the tapped delay-line may provide an integer delay (e.g. with respect to the sampling interval) while the digital interpolation filter may provide fractional delay compensation. In some examples, the integer delay provided by the tapped delay line may be realized by selecting from among samples stored in the tapped delay line at least in part based on the down track separation.

In addition, because the phase control signal feedback from the digital receiver may change the sampling phase of the system between when a first sensor detecting a portion of data and a second sensor sensing the same portion of the data, the system may compensate for any phase misalignment that may result due to changes in the sampling clock.

An example of such a system is discussed below with regard to FIG. 1.

Referring to FIG. 1, a block diagram of a communication channel which may include functionality to compensate for differences in phase adjustment between the sensing of multiple signals is shown and is generally designated 100. More particularly, FIG. 1 may illustrate an example embodiment of a read channel of a multi-reader magnetic storage system that includes functionality to compensate for differences in phase adjustment between the sensing of the multiple signals. System 100 may include two readers of a same read head, reader 102 and reader 104, which may be reading from a track 106 on a surface 108 of a magnetic storage medium. Readers 102 and 104 may be coupled to respective analog front-ends (AFEs) 110 and 112 (e.g. illustrated as the inputs to 110 and 112) which in turn may be coupled to respective analog-to-digital converters (ADCs) 114 and 116. The system may further include a phase locked loop (PLL) 118 that may be coupled to a phase interpolator 120. The phase interpolator may be coupled to the ADCs 114 and 116 and a digital receiver circuit 122. The ADCs 114 and 116 may be coupled to respective delay modules 124 and 126 which may in turn be coupled to the digital receiver circuit 122. The digital receiver circuit 122 may be coupled to a timing control circuit 128 and the phase interpolator 120. The timing control circuit 128 may be coupled to the phase interpolator 120 and adders 130 and 132. In turn, the adders 130 and 132 may be coupled to the delay modules 124 and 126.

Each of the readers 102 and 104, the AFEs 110 and 112, the ADCs 114 and 116, PLL 118, the phase interpolator 120, the digital receiver circuit 122, the delay modules 124 and 126, the timing control circuit 128, and adders 130 and 132 may be a separate circuit, a system on chip (SOC), firmware, a processor(s), or other system not listed, or any combination thereof.

As mentioned above, the readers (or read-sensors) 102 and 104 may read from a track 106 on a surface 108 of a magnetic storage medium. The readers 102 and 104 may each produce a continuous time input signal $z_0(t)$ 134 and $z_1(t)$ 136 and may provide the continuous time input signals $x_0(t)$ 138 and $x_1(t)$ 140 to ADCs 114 and 116 respectively. In operation, the AFEs may each receive a continuous-time signal and perform processing such as analog filtering and applying a gain.

The PLL 118 may operate to produce a clock signal (c) 142 which it may then be provided to the phase interpolator 120. The phase interpolator 120 may receive the clock signal (c) 142 from the PLL 108 and the phase control 154 from the digital receiver 122 and generate a phase shifted clock signal (ĉ) 144 based thereon. In some examples, the phase interpolator 120 may be a circuit that may adjust the phase of an input clock signal (c) 142.

The ADCs 114 and 116 may each receive the phase shifted clock signal (ĉ) 144 and a respective continuous-time signal $x_0(t)$ 138 and $x_1(t)$ 140. Each ADC 114 and 116 may sample and quantize the respective continuous-time signal $x_0(t)$ 138 and $x_1(t)$ 140 at intervals based on the phase shifted clock signal (ĉ) 144 to produce a respective digitized sequence of samples $x_{0,k}$ 146 and $x_{1,k}$ 148.

The delay modules 124 and 126 may each may receive a respective digitized sequence of samples $x_{0,k}$ 146 and $x_{1,k}$ 148 and the output of a respective adder 130 and 132. As mentioned above, the delay modules 124 and 126 may delay the respective digitized sequence of samples $x_{0,k}$ 146 and $x_{1,k}$ 148 based on the values output by the respective adder 130 and 132. For example, the delay modules 124 and 126 may include a tapped delay line to perform the integer portion of the delay and may include a digital interpolator to perform digital interpolation of the integer delayed digitized sequence of samples based on the fractional portion of the delay to generate the respective phase shifted sample sequences $y_{0,k}$ 150 and $y_{1,k}$ 152.

The digital receiver 122 may receive the phase shifted sample sequences $y_{0,k}$ 150 and $y_{1,k}$ 152 and the phase shifted clock signal (ĉ) 144. Using the phase shifted clock signal (ĉ) 144 to clock its logic, the digital receiver 122 may process the phase shifted sample sequences $y_{0,k}$ 150 and $y_{1,k}$ 152. In addition, the digital receiver 122 may determine or estimate a deviation of the phase of the clock signal from a target phase and return the deviation to the timing control circuit and phase interpolator as the phase control 154.

As mentioned above, adders 130 and 132 may each receive a respective known or estimated delay $d_{0,k}$ 156 and $d_{1,k}$ 158 and a respective phase compensation value $a_{0,k}$ 160 and $a_{1,k}$ 162. For example, the delays $d_{0,k}$ 156 and $d_{1,k}$ 158 may compensate for the separation delay between the sensors. As mentioned previously, the separation of the reader-sensors on a read head with respect to a magnetic storage medium may change depending on what area of the medium is being written. As such, the delays $d_{0,k}$ 156 and $d_{1,k}$ 158 for various zones may be stored in a memory. In operation, the values for those zones may be loaded for use in operation (e.g. on track seek). In other embodiments, the values may be determined in the field or on a continuous basis.

The timing control circuit 128 may generate control signals $a_{0,k}$ 160 and $a_{1,k}$ 162 based on the phase control 154 and output the control signals $a_{0,k}$ 160 and $a_{1,k}$ 162 to the adders 130 and 132 respectively. As mentioned above, the timing control circuit 128 may generate the phase compensation values $a_{0,k}$ 160 and $a_{1,k}$ 162 to compensate for variable phase misalignment between the signals from readers 102 and 104 due to adjustment of the phase control 154 between the sensing of the data by a leading reader and the subsequent sensing of the data by the trailing reader. An example situation in which this issue may arise is shown in FIGS. 2A and 2B.

FIGS. 2A and 2B may illustrate a MSMR system in operation at a first time 200 and a second time 250, respectively. At time 200, the first reader 102 may sample bit-cell 202 of the track 106. At time 250 (e.g. three sample periods or cycles later), the second reader 104 may sample the bit-cell 202 of the track 106. As illustrated, the first and second readers may have a separation 204 that may include an integer separation delay of three sampling periods or clock cycles and some fractional delay such that both readers may not be centered over a respective bit-cell at sampling. As mentioned above, the delays $d_{0,k}$ 156 and $d_{1,k}$ 158 may compensate for the separation 204. If the clock phase, as specified by the phase control ($c_k$) 154, remains unchanged between the sampling of bit cell 202 at times 200 and 250, then delays $d_{0,k}$ 156 and $d_{1,k}$ 158 may sufficiently phase align the samples of bit-cell 202. However, if the clock phase, as specified by the phase control ($c_k$) 154, differs between the samplings of bit cell 202 at times 200 and 250, a phase misalignment may be induced on the samples. The induced misalignment, which may be exacerbated both by larger downtrack reader separations and faster phase control ($c_k$) 154 changes, may cause significant degradation to a digital receiver 122 whose operation may rely on time alignment of the phase shifted sample sequences $y_{0,k}$ 150 and $y_{1,k}$ 152.

Figure 3:
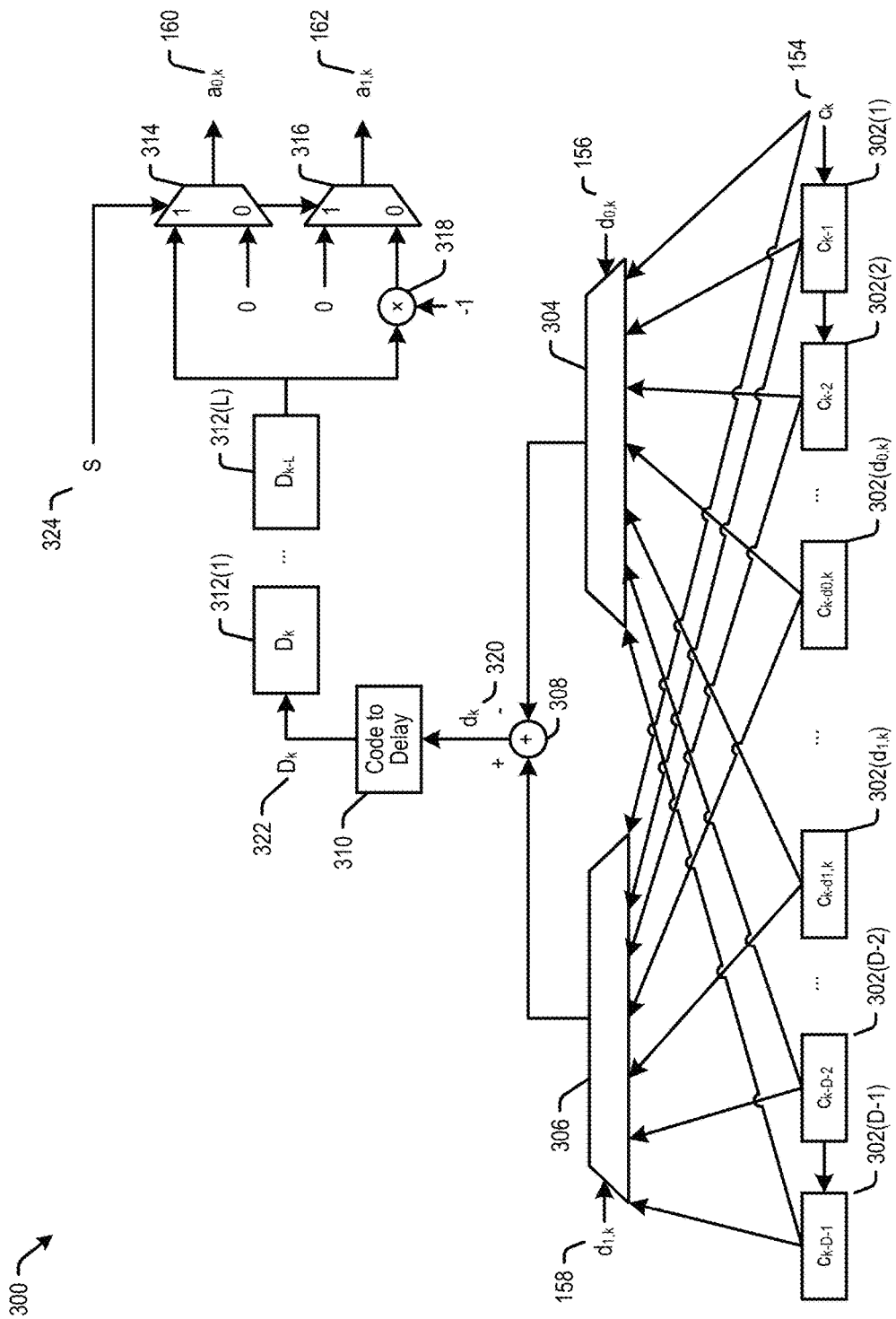
FIG. 3 illustrates a block diagram of a timing control circuit which may include functionality to compensate for differences in phase adjustment between the sensing of the multiple signals, in accordance with certain embodiments of the present disclosure.

As mentioned above, the timing control circuit 128 may generate the phase compensation values $a_{0,k}$ 160 and $a_{1,k}$ 162 to compensate for variable phase misalignment due to adjustment of the phase control 154 between the sensing of underlying data between the signals from readers 102 and 104 due to adjustment of the phase control 154 between the sensing of the data by a leading reader and the subsequent sensing of the data by the trailing reader. More particularly, the timing control circuit 128 may generate an induced timing-offset associated with each pair of samples (corresponding to the same bit-cell) and may compensate for the induced timing offset by applying a correction factor to one of the delay modules 124 and 126 (e.g. in the form of phase compensation values $a_{0,k}$ 160 and $a_{1,k}$ 162) through adders 130 and 132. An example embodiment of the timing control circuit 128 is shown in FIG. 3 and discussed below. Though phase compensation is applied to one of the delay modules in the examples herein, in other embodiments, the phase compensation may be apportioned between the delay modules.

In summary, at time k, the ADC 114 and ADC 116 may operate to generate ADC samples $x_{0,k}$ 146 and $x_{1,k}$ 148, respectively, based on the phase shifted clock signal (ĉ) 144 whose phase may be adjusted between sampling periods based on the phase control ($c_k$) 154. The delay modules 124 and 126 may then produce phase shifted samples $y_{0,k}$ 150 and $y_{1,k}$ 152 based on the sum of the delays $d_{0,k}$ and $d_{1,k}$ and phase compensation values $a_{0,k}$ 160 and $a_{1,k}$ 162. Since these phase shifted samples $y_{0,k}$ 150 and $y_{1,k}$ 152 may be generated using delayed ADC samples, the values of phase shifted samples $y_{0,k}$ 150 and $y_{1,k}$ 152 may be generated using ADC samples sampled with phase control 154 values $c_{k-d_{0,k}}$ and $c_{k-d_{1,k}}$ as:

$$y_{0,k}=f(c_{k-d_{0,k}})$$

$$y_{1,k}=f(c_{k-d_{1,k}}) \quad (1)$$

It should be noted that the separation between the sensors may change such that a sensor which is a lead sensor may become the trailing sensor. For example, a track seek in a MSMR system from a track to a more outer track (or vice versa) may cause a leading reader to become a trailing reader due to the geometry of the readers on the read head.

Referring to FIG. 3, a block diagram of a timing control circuit which may include functionality to compensate for differences in phase adjustment between the sensing of the multiple signals is shown and is generally designated 300. More particularly, FIG. 3 may illustrate an example embodiment of a timing control circuit of a read channel of a multi-reader magnetic storage system that includes functionality to compensate for differences in phase adjustment between the sensing of the multiple signals such as that illustrated in FIG. 1. System 100 may include a tapped delay-line 302 of length D (e.g. tapped delay cells 302(1)-302(D−1)) that are coupled to multiplexers 304 and 306. The multiplexers 304 and 306 may be coupled to a difference circuit 308. The difference circuit 308 may be coupled to a code to delay circuit 310 which may be coupled to a delay-line 312 that includes delay cells 312(1)-312(L). The delay line 312 may be coupled to a multiplexer 314 and an inverter 318. The inverter 318 may be coupled to a multiplexer 316.

Each of the delay-line 302, multiplexers 304 and 306, difference circuit 308, code to delay circuit 310, delay-line 312, multiplexer 314 and 316, and inverter 318 may be a separate circuit, a system on chip (SOC), firmware, a processor(s), or other system not listed, or any combination thereof.

In operation, the tapped delay line 302 may receive the phase control ($c_k$) 154 and may shift the values of the phase control through the delay cells. The length of the delay line 302 may be based on D which may be the largest value for $d_{0,k}$ 156 and $d_{1,k}$ 158. At each sample period or cycle, the delay cells 302 may output the delayed values of the phase control ($c_k$) 154 to the multiplexers 304 and 306.

The multiplexers 304 and 306 may receive a respective delay values $d_{0,k}$ 156 and $d_{1,k}$ 158, the phase control ($c_k$) 154, and the delayed phase control values ($c_{k-1}$-$c_{k-D-1}$) from delay cells 302(1)-302(D-1). The multiplexers 304 and 306 may each utilize the respective delay value $d_{0,k}$ 156 and $d_{1,k}$ 158 to select a respective one of the phase control ($c_k$) 154 and the delayed phase control values ($c_{k-1}$-$c_{k-D-1}$) to output to the difference circuit 308. In general, due to the delays of $d_{0,k}$ and $d_{1,k}$ through the delay modules 124 and 126, $y_{0,k}$ and $y_k$k may be generated from ADC samples $d_{0,k}$ and $d_{1,k}$ earlier. The delay cell and multiplexer structure formed by 302-306 may operate to select the phase control codes to be used to generate ADC samples. For example, if $d_{0,k}$=5 and $d_{1,k}$=1, then $y_{0,k}$ may effectively be generated from the phase control code 5 cycles earlier, whereas $y_k$k may be generated from the phase control code 1 cycle earlier. Thus, the delay cell and multiplexer structure formed by 302-306 may operate to select the values to compute their difference.

The difference circuit 308 may determine a difference $d_k$ 320 in the phase control values selected and output by multiplexers 304 and 306. The difference $d_k$ 320 may represent the phase misalignment for the sample period or cycle. The difference circuit 308 may output the difference $d_k$ 320 to the code to delay circuit 310. The code to delay circuit 310 may translate the difference $d_k$ 320 to a timing difference ($D_k$) 322 that may be in the same units as delays $d_{0,k}$ 156 and $d_{1,k}$ 158. The code to delay circuit 310 may output the timing difference $D_k$ 322 to the delay line 312.

The delay line 312 may receive and delay the timing difference $D_k$ 322 for L sampling periods or cycles. In some embodiments, a latency may exist between when the phase control may be generated and when the generated phase control may be reflected ADC samples. This latency may exist both in the phase interpolator 120 and the ADCs 114 and 116. This may be accounted for by delaying the timing difference $D_k$ 322 for a time equal to the latency (L) between receiving the phase control and when the phase control value may be reflected in ADC samples. The delay line 312 may output the delayed timing difference to the multiplexer 314 and the inverter 318. The inverter may output the inverted delayed timing difference to the multiplexer 316.

The multiplexers 314 and 316 may utilize a select value S 324 to select between outputting the delayed timing difference (or inverted delayed timing difference) or a zero value as the value of phase compensation values $a_{0,k}$ 160 and $a_{1,k}$ 162, respectively. In some embodiments, the select value S 324 may be set to apply the difference to the signal from the leading reader (i.e. the reader with a larger delay value) and apply a zero to the trailing reader.

In effect, the timing control circuit illustrated in FIG. 3 and discussed above may track the movement of the phase control 154 over time by applying the utilized values to the tapped delay-line 302. Using delay-line 302, the multiplexers 304 and 306 and the difference circuit 308 may compute the difference $d_k$ 320 that may represent the misalignment due to changes in the phase control 154. The difference $d_k$ 320 may be translated to a timing difference ($D_k$) 322 in the same units of the delay controls $d_{0,k}$ 156 and $d_{1,k}$ 158. The translation from code to delay units may include an unwrapping operation. For example, in some embodiments, the phase control 154 may specify a phase as a 6-bit value in {0, 1, . . . , 63} specifying a phase over 1 sampling period (T). In this example, increasing the phase control 154 by 1 from 63 would result in a value 0, which may correspond to an advance in phase by ⅟₆₄T on the next clock edge. As such, if the codes utilized to generate ADC samples are 62 and 2, the difference of $\delta_k$=(2-62)=-60 would be unwrapped as 4, which would then be translated into a time delay of $D_k$=4/64T.

The delay line 312 may delay the timing difference $D_k$ 322 to account for the latency (L) between receiving the phase control and when the phase control value may be reflected in ADC samples. The phase compensation values $a_{0,k}$ and $a_{1,k}$ may then be determined. As shown, the phase compensation may be applied to the delay module 124 or, with an inverted sign, to delay module 126. The phase compensation for the non-selected sensor may be 0.

As mentioned above, in some embodiments, the select value S 324 may be configured to apply the phase compensation to the leading reader (i.e. the reader with a larger delay value) rather than the trailing reader. In such embodiments, the phase compensation may be adjusting the sampling phase of one read-sensor to match the other. By phase compensating the leading reader, the sampling phase of the leading reader may be matched to a more recent phase control value as the phase control value of the trailing reader may be more recent. In other words, when the leading reader samples a given bit-cell at time t, the phase control 154 may at a value a, whereas when the trailing reader samples the same bit-cell at time (t+delay), the phase control 154 may have changed to a value b. If compensation is applied to the trailing reader, the phase control value may be reverted back to the older value of a for this bit-cell, whereas if compensation were applied to the leading reader the phase control value may be advanced to the newer value of b for this bit-cell. Thus, applying compensation to the leading reader may allow for the newer phase control values to be utilized.

Figure 4:
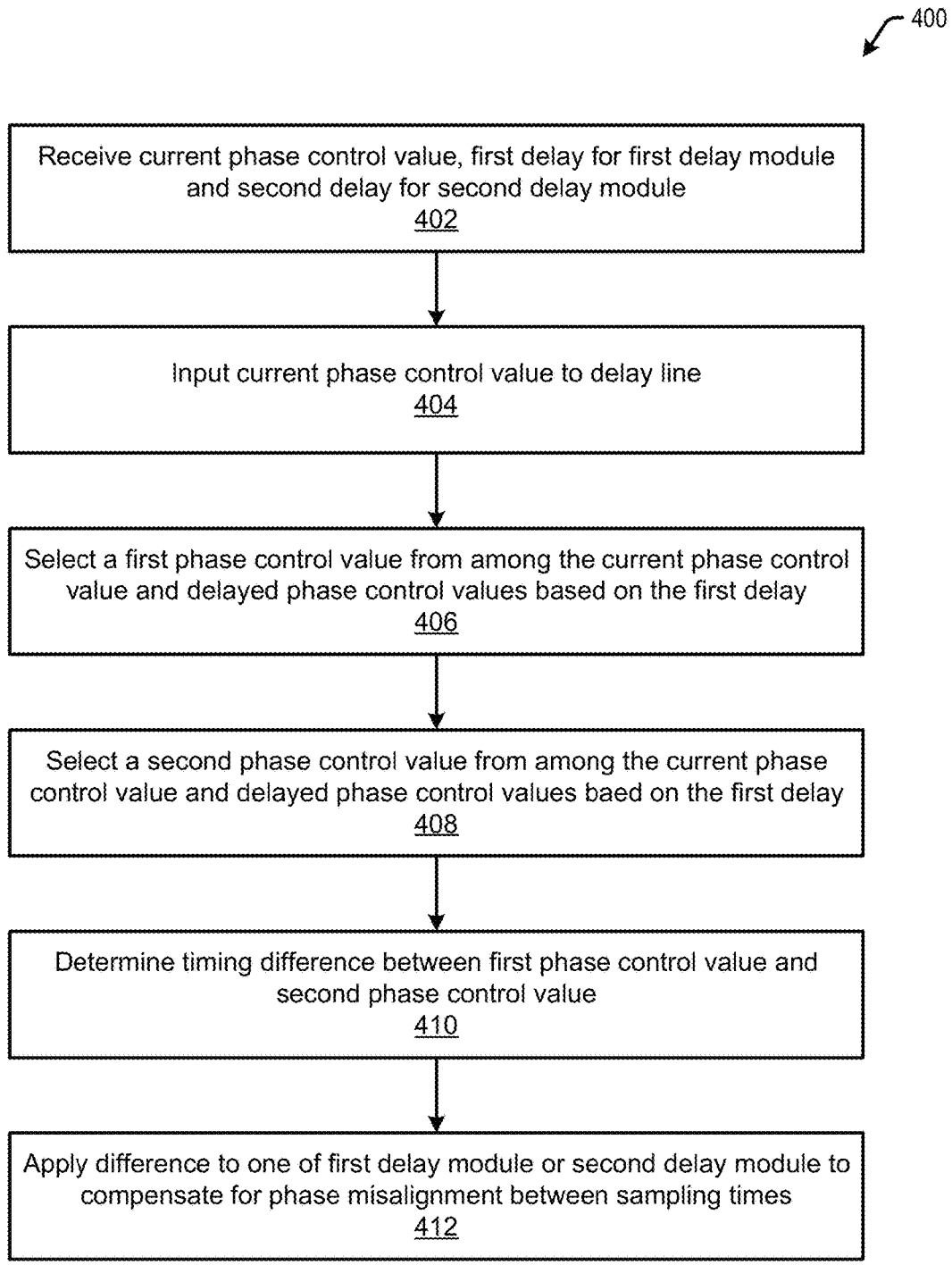
FIG. 4 is a flowchart of a method of compensating for differences in phase adjustment between the sensing of multiple signals, in accordance with certain embodiments of the present disclosure.

Referring to FIG. 4, a flowchart of a method of compensating for differences in phase adjustment between the sensing of multiple signals is shown and is generally designated 400. More particularly, flowchart 400 may be a flow of operations of the timing control circuit 128 detailed above with respect to FIGS. 1-3.

In operation, the system may receive a current phase control value, a first delay for the first delay module and a second delay for the second delay module at 402. At 404, the timing control circuit may input the current phase control value to a delay line. The use of a delay line is merely an example and other storage or memory may be utilized in other embodiments. At 406, based on the first delay for the first delay module, the system may select a first phase control value from among the current phase control value and delayed phase control values. At 408, based on the second delay for the second delay module, the system may select a second phase control value from among the current phase control value and delayed phase control values. Next, the timing control circuit may determine a timing difference between the first phase control value and the second phase control value at 410. In some examples, the timing difference may be delayed to account for latency in the application of the phase control and its reflection in the ADC samples.

Then, at 412, the timing control circuit may apply the timing difference to one of the first delay module or the second delay module to compensate for the phase misalignment of the samples being processed by the first delay module and the second delay module due to changes in the phase control values.

All steps listed for the method 400 may be applied to multiple input systems. Many variations would be apparent in view of this disclosure. Components and circuits used to perform the operations in the method may be discrete, integrated into a system on chip (SOC), or other circuits. Further, the steps can be carried out in a processor (e.g. a digital signal processor), implemented in software, implemented via firmware, or by other means.

Figure 5:
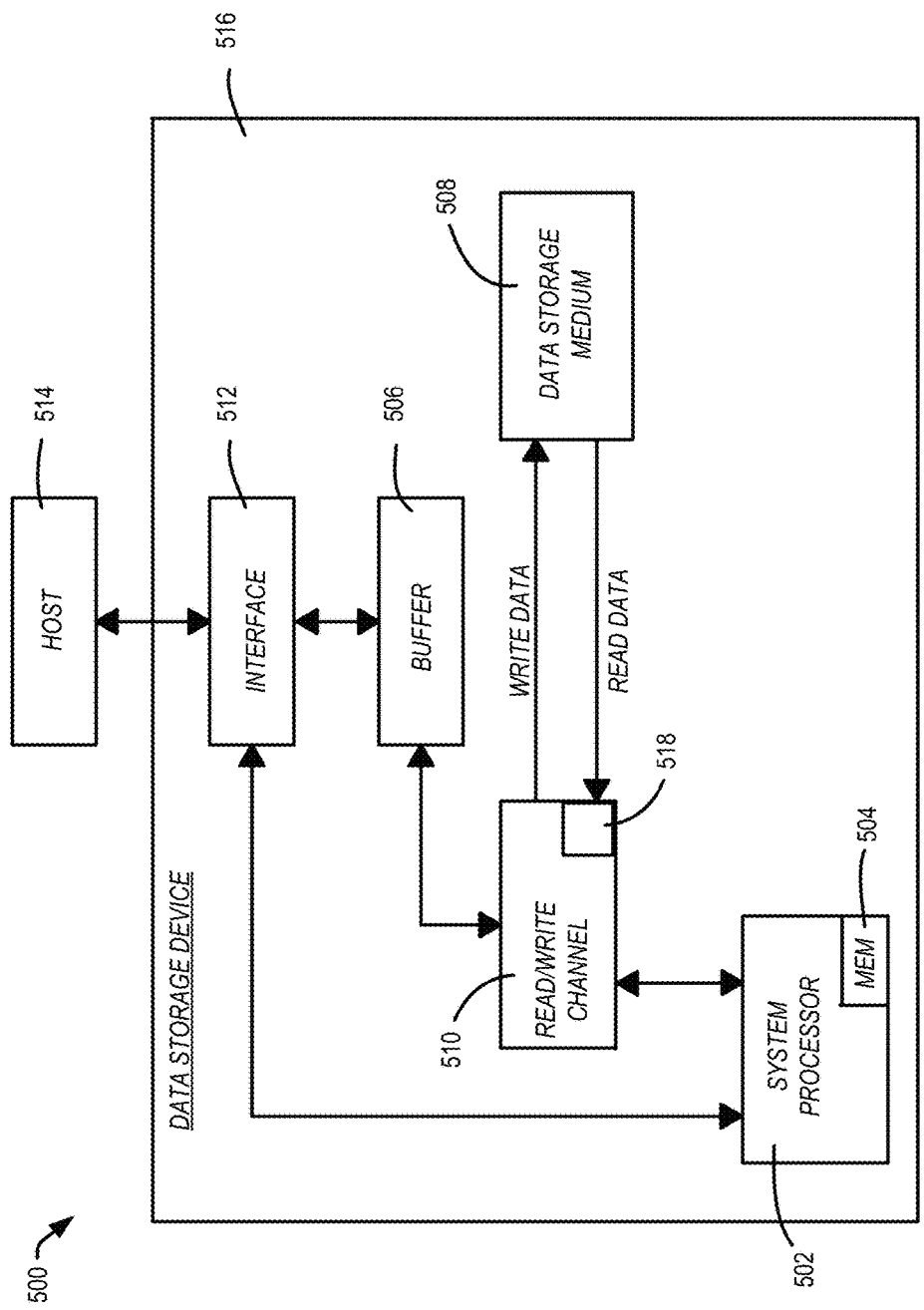
FIG. 5 is a block diagram of a system including hybrid timing recovery functionality, in accordance with certain embodiments of the present disclosure.

Referring to FIG. 5, a block diagram of a system including hybrid timing recovery is shown and generally designated 500. The system 500 can be an example of a data storage device (DSD), and may be an example implementation of system 100. The DSD 516 can optionally connect to and be removable from a host device 514, which can be a device or system having stored data, such as a desktop computer, a laptop computer, a server, a digital video recorder, a photocopier, a telephone, a music player, other electronic devices or systems not listed, or any combination thereof. The data storage device 516 can communicate with the host device 514 via the hardware/firmware based host interface circuit 512 that may include a connector (not shown) that allows the DSD 516 to be physically connected and disconnected from the host 514.

The DSD 516 can include a system processor 502, which may be a programmable controller, and associated memory 504. The system processor 502 may be part of a system on chip (SOC). A buffer 506 may temporarily store data during read and write operations and can include a command queue. The read/write (R/W) channel 510 can encode data during write operations to, and reconstruct data during read operations from, the data storage medium 508. The data storage medium 508 is shown and described as a hard disc drive, but may be other types of magnetic medium, such as a flash medium, optical medium, or other medium, or any combination thereof.

The R/W channel 510 may receive data from more than one data storage medium at a time, and in some embodiments can also receive multiple data signals concurrently, such as from more than one output of a reader. Multi-sensor magnetic recording (MSMR) systems can receive two or more inputs from multiple sources (e.g. recording heads, flash memory, optical memory, and so forth) associated with the same magnetic medium. The R/W channel 510 can combine multiple inputs and provide a single output, as described in examples herein.

The block 518 can implement all of or part of the systems and functionality of systems and methods 100-400. In some embodiments, the block 518 may be a separate circuit, integrated into the R/W channel 510, included in a system on chip, firmware, software, or any combination thereof.

In the examples discussed herein, two signals are received and processed. However, the systems and methods discussed herein may be generalized to any number (N) of signals. For example, compensation may be conducted in a pairwise manner, where each of (N−1) delays may be compensated to align the signal to the remaining signal which, as described, may be chosen as that which have minimum delay (e.g. the most trailing reader). Moreover, while the discussion herein centers around read channels as examples, the disclosed techniques and systems may apply to other circuits. Many variations would be apparent to one of ordinary skill in the art in view of this disclosure.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a circuit configured to:
   receive a first sample of a first sample period, the first sample corresponding to a first sensor, a phase control value having a first value during the first sample period;
   receive a second sample of a second sample period, the second sample corresponding to a second sensor, the phase control value having a second value during the second sample period, the first sample and the second sample being samples of the same underlying data, and the phase control value being a control value for a sample clock signal associated with the first sample and the second sample;
   determine a difference in the phase control value between the first value during the first sample period and the second value during the second sample period;
   digitally interpolate the first sample to produce a phase shifted first sample; and
   digitally interpolate the second sample to produce a phase shifted second sample, the digital interpolation of at least one of the first sample and the second sample being at least in part based on the difference in the phase control value to compensate for a phase misalignment between the first sample and the second sample due to the difference in the phase control value between the first value during the first sample period and the second value during the second sample period.

2. The apparatus of claim 1, further comprising the circuit further including a first analog-to-digital converter (ADC) configured to produce the first sample based on the sample clock signal and a first signal associated with the first sensor and a second analog-to-digital converter (ADC) configured to produce the second sample based on the sample clock signal and a second signal associated with the second sensor.

3. The apparatus of claim 2, further comprising the first sensor and the second sensor being readers of a read head of a multi-sensor magnetic recording (MSMR) system.

4. The apparatus of claim 3, further comprising a first separation between the sensing of the underlying data by the first sensor and the second sensor being different from a second separation between the sensing of a second underlying data by the first sensor and the second sensor, the underlying data and the second underlying data located in different tracks on a same magnetic storage medium.

5. The apparatus of claim 2, further comprising the circuit further including a phase interpolator configured to perform a phase interpolation of a source clock signal based on the phase control to produce the sample clock.

6. The apparatus of claim 3 further comprising:
a buffer that buffers phase control values for at least a delay period;
a selector circuit that selects the first value of the phase control from the buffer and the second value of the phase control from the buffer;
a difference circuit that determines the difference between the first value and the second value based on the difference between the selected first value and the selected second value.

7. The apparatus of claim 6, further comprising a digital receiver that processes the phase shifted first sample and the phase shifted second sample, a logic of the digital receiver being clocked based on the sample clock.

8. The apparatus of claim 7, further comprising the digital receiver being one of a decoder, a filter or a detector.

9. The apparatus of claim 7, further comprising the digital receiver further configured to generate the phase control signal based on a deviation of the phase of the sample clock from a target phase.

10. A system comprising:
a first delay module configured to receive a first sample of a first sample period, the first sample corresponding to a first sensor, a phase control value having a first value during the first sample period;
a second delay module configured to receive a second sample of a second sample period, the second sample corresponding to a second sensor, the phase control value having a second value during the second sample period, the first sample and the second sample being samples of the same underlying data, and the phase control value being a control value for a sample clock signal associated with the first sample and the second sample;
a timing control circuit configured to:
determine a difference in the phase control value between the first value during the first sample period and the second value during the second sample period;
the first delay module further configured to digitally interpolate the first sample to produce a phase shifted first sample; and
the second delay module further configured to digitally interpolate the second sample to produce a phase shifted second sample, the digital interpolation of at least one of the first sample and the second sample being at least in part based on the difference in the phase control value to compensate for a phase misalignment between the first sample and the second sample due to the difference in the phase control value between the first value during the first sample period and the second value during the second sample period.

11. The system of claim 10 further comprising:
a first analog-to-digital converter (ADC) configured to produce the first sample based on the sample clock signal and a first signal associated with the first sensor; and
a second analog-to-digital converter (ADC) configured to produce the second sample based on the sample clock signal and a second signal associated with the second sensor.

12. The system of claim 11 further comprising the first sensor and the second sensor being readers of a read head of a multi-sensor magnetic recording (MSMR) system.

13. The system of claim 12 further comprising a first separation between the sensing of the underlying data by the first sensor and the second sensor being different from a second separation between the sensing of a second underlying data by the first sensor and the second sensor, the underlying data and the second underlying data located in different tracks on a same magnetic storage medium.

14. The system of claim 12 further comprising:
a phase interpolator configured to perform a phase interpolation of a source clock signal based on the phase control to produce the sample clock.

15. The system of claim 12 further comprising:
a buffer that buffers phase control values for at least a delay period;
a selector circuit that selects the first value of the phase control from the buffer and the second value of the phase control from the buffer; and
a difference circuit that determines the difference between the first value and the second value based on the difference between the selected first value and the selected second value.

16. The system of claim 10 further comprising a digital receiver that processes the phase shifted first sample and the phase shifted second sample, a logic of the digital receiver being clocked based on the sample clock and generates the phase control signal based on a deviation of the phase of the sample clock from a target phase.

17. A method comprising:
receiving a first sample of a first sample period, the first sample corresponding to a first sensor, a phase control value having a first value during the first sample period;
receiving a second sample of a second sample period, the second sample corresponding to a second sensor, the phase control value having a second value during the second sample period, the first sample and the second sample being samples of the same underlying data, and the phase control value being a control value for a sample clock signal associated with the first sample and the second sample;
determining a difference in the phase control value between the first value during the first sample period and the second value during the second sample period;
digitally interpolating the first sample to produce a phase shifted first sample; and
digitally interpolating the second sample to produce a phase shifted second sample, the digital interpolation of at least one of the first sample and the second sample being at least in part based on the difference in the phase control value to compensate for a phase misalignment between the first sample and the second sample due to the difference in the phase control value between the first value during the first sample period and the second value during the second sample period.

18. The method of claim 17 further comprising
generating, by a first analog-to-digital converter (ADC), the first sample based on the sample clock signal and a first signal associated with the first sensor; and
generating, by a second analog-to-digital converter (ADC), the second sample based on the sample clock signal and a second signal associated with the second sensor.

19. The method of claim 18 further comprising the first sensor and the second sensor being readers of a read head of a multi-sensor magnetic recording (MSMR) system.

20. The method of claim 19 further comprising:
processing, by a digital receiver, the phase shifted first sample and the phase shifted second sample, a logic of the digital receiver being clocked based on the sample clock; and
generating, by the digital receiver, the phase control value based on a deviation of the phase of the sample clock from a target phase.

* * * * *